United States Patent [19]
Kishi et al.

[11] Patent Number: 5,987,635
[45] Date of Patent: Nov. 16, 1999

[54] SEMICONDUCTOR INTEGRATED CIRCUIT DEVICE CAPABLE OF SIMULTANEOUSLY PERFORMING SELF-TEST ON MEMORY CIRCUITS AND LOGIC CIRCUITS

[75] Inventors: Tetsuji Kishi, Osaka; Yoshimichi Nagasaki, Kyoto, both of Japan

[73] Assignee: Matsushita Electric Industrial Co., Ltd., Osaka, Japan

[21] Appl. No.: 08/847,992

[22] Filed: Apr. 22, 1997

[30] Foreign Application Priority Data

Apr. 23, 1996 [JP] Japan .................................... 8-100927

[51] Int. Cl.⁶ .................................................. G01R 31/28
[52] U.S. Cl. ............................................................ 714/724
[58] Field of Search ................................ 714/724, 726, 714/727, 729, 718; 365/201; 324/73.1, 158.1

[56] References Cited

U.S. PATENT DOCUMENTS

| | | | |
|---|---|---|---|
| 4,709,279 | 11/1987 | Sano et al. | 360/78 |
| 5,111,433 | 5/1992 | Miyamoto | 365/201 |
| 5,369,611 | 11/1994 | Miura | 365/201 |
| 5,604,756 | 2/1997 | Kawata | 371/67.1 |

FOREIGN PATENT DOCUMENTS

| | | |
|---|---|---|
| 05034419 | 2/1993 | Japan . |
| 05120899 | 5/1993 | Japan . |

Primary Examiner—Hoa T. Nguyen
Attorney, Agent, or Firm—McDermott, Will & Emery

[57] ABSTRACT

An image processor, included in a logic circuit unit, for executing an image processing of data according to the MPEG standard and the like, a memory circuit unit, whose input port is included in the logic circuit unit, for storing image processed data, and a memory control unit, included in the logic circuit unit, for controlling the input/output operation of the memory circuit unit are formed on a semiconductor substrate. Between the memory circuit unit and the memory control unit, a selector is interposed for selecting, in accordance with a test mode signal, an externally input first chip select control signal when the test mode signal is activated, and selecting a second chip select control signal output by a memory control circuit and outputting a chip select signal to the memory circuit unit when the test mode signal is deactivated.

10 Claims, 8 Drawing Sheets

Fig. 8
PRIOR ART

SEMICONDUCTOR INTEGRATED CIRCUIT DEVICE CAPABLE OF SIMULTANEOUSLY PERFORMING SELF-TEST ON MEMORY CIRCUITS AND LOGIC CIRCUITS

BACKGROUND OF THE INVENTION

The present invention relates to a semiconductor integrated circuit device including a memory circuit and a logic circuit and a method of testing the semiconductor integrated circuit device.

Recently, various types of semiconductor integrated circuit devices (hereinafter referred to as LSIs) with a variety of memory built-in structures have been put in practical use. For example, in order to attain a high speed data processing, a plurality of memories each with a small capacity are provided on the same substrate as data processing buffers, or a memory with a large capacity such a cache memory of a microprocessor is provided on the same substrate.

Therefore, not only increase of the scale of the LSI but also security for test coverage, decrease of an increasing test time, etc. in conducting a functional test of the LSI have become significant problems.

In general, an operation test of an internal combinational circuit including a logic circuit built in an LSI (namely, the so-called logic test) is carried out by supplying the LSI with a predetermined test vector for confirming the function of the LSI and by comparing an operational value in response to the test vector read from the LSI with an expected value. This is not, however, a very good method to secure the test coverage of the operation test with a small number of test vectors.

Accordingly, a flip-flop or the like built in an LSI is recently provided with a sequential circuit having a scan function, and a test by a scanning method using the sequential circuit has been occasionally adopted. The test by the scanning method (hereinafter referred to as the scan test) is described in, for example, "Digital Kairo No Kosho Shindan, vol. 1" by Kinoshita, et al., pp. 214–215, published by Kogaku Tosho K. K.). Furthermore, a memory test for a built-in memory in an LSI is carried out by conducting a data read/write test using a predetermined algorithm such as a marching algorithm and a checker algorithm.

However, the read/write test is not sufficient in the built-in memory. For example, even when the built-in memory has a memory cell structure of an SRAM base, there is possibility of occurrence of a production problem such as data disappearance due to a leakage current in a specific memory cell. Therefore, a test for securing data hold during a predetermined time period is required to be conducted. Specifically, in this data holding test, a predetermined data is previously written in a memory, no data is written in or read from the memory for a predetermined period of time, and it is checked whether or not the written data is held after the predetermined period of time. The data holding test requires a holding period of several tens through several hundreds ms (milliseconds) during which no memory access is executed. This period is much longer than a general operation time of an LSI of several through several tens ns (nanoseconds).

Now, a method of testing a conventional LSI will be described with reference to the accompanying drawing.

Figure 8:
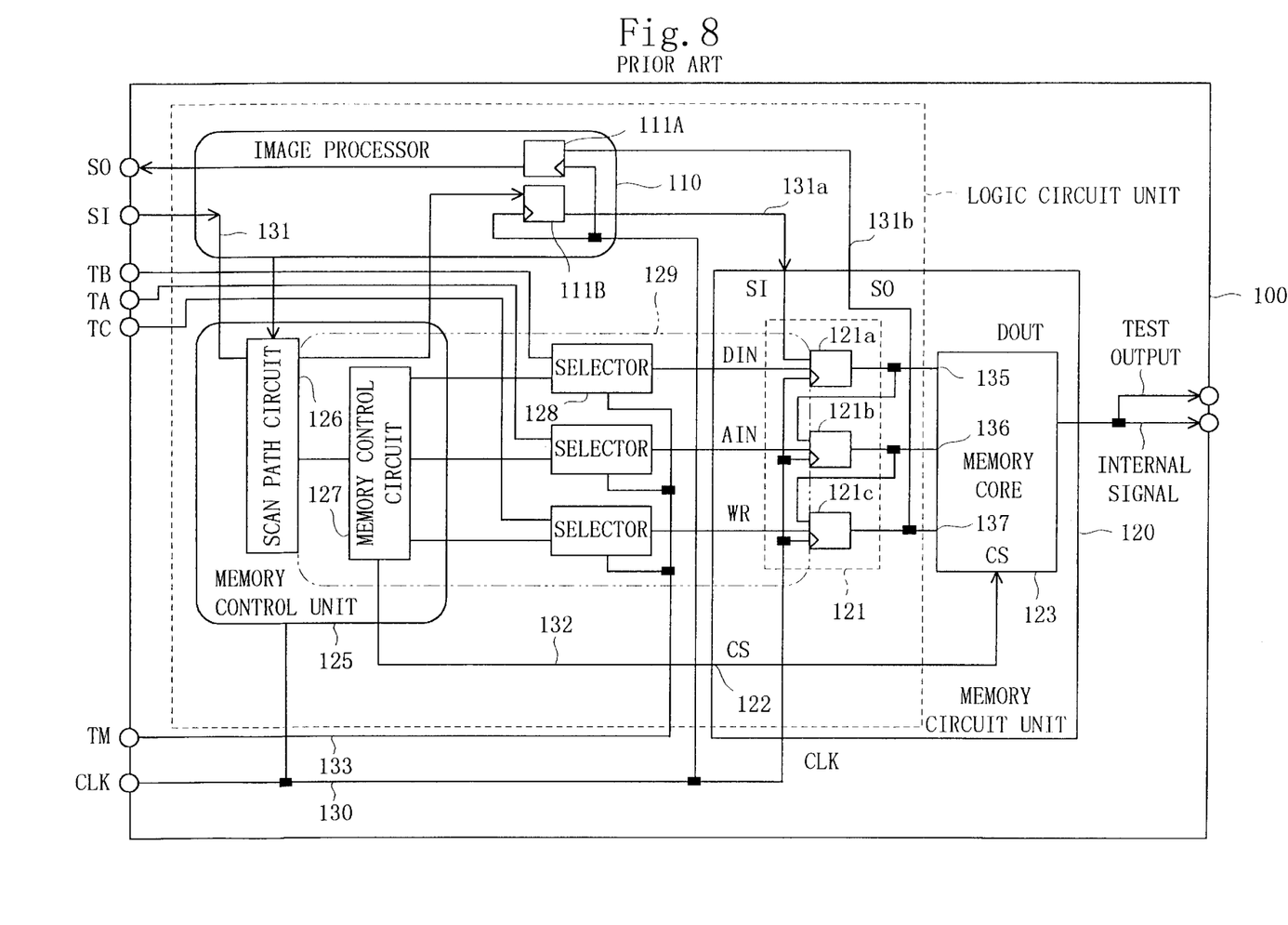
FIG. 8 is a circuit diagram of a conventional LSI.

FIG. 8 is a circuit diagram of the conventional LSI. As is shown in FIG. 8, on a semiconductor substrate 100 are formed an image processor 110 for executing an image processing of data according to the MPEG standard and computer graphic (CG) data, a memory circuit unit 120 for storing image processed data, and a memory control unit 125 for controlling an input/output operation of the memory circuit unit 120. The image processor 110, the memory circuit unit 120 and the memory control unit 125 are respectively supplied with a clock signal 130 for synchronizing the input/output of data.

The image processor 110 includes scan-functioning flip-flops 111A and 111B having a scan path for the scan test, which is one of the operation tests for the image processor 110.

The memory circuit unit 120 includes a scan-functioning flip-flop 121a for synchronizing an internal data bus DIN on the basis of the clock signal 130, a scan-functioning flip-flop 121b for synchronizing an internal address bus AIN on the basis of the clock signal 130, a scan-functioning flip-flop 121c for synchronizing an internal control signal WR on the basis of the clock signal 130, and a memory core 123 for receiving a synchronous data signal 135, a synchronous address signal 136 and a synchronous memory control signal 137 and storing image processed data and the write/read operations thereof. In this circuit, the flip-flops 121a through 121c form a first scan path circuit 121.

In an LSI having a clock synchronous memory like this conventional LSI, the flip-flops 121a through 121c for synchronizing input data for the memory circuit unit 120 are provided with the scan function, so that a test data input from the memory control unit 125 to the first scan path circuit 121 can be subjected to the scan test by using a data path including testing selectors. Thus, the test coverage in a testable area 129 can be improved. Furthermore, since the test is batched, the management of the test coverage can be batched with regard to each test item. This leads to an advantage that fails in the memory circuit unit 120 and the memory control unit 125 can be distinguished from each other with ease. In addition, when the LSI does not have a single-chip structure, for example, when the memory circuit unit 120 and the memory control unit 125 are formed on the separate substrates, these substrates are connected with each other through a printed substrate. This leads to another advantage that these units can be tested separately from the memory core 123.

The memory circuit unit 120 is provided with a CS terminal 122 for receiving a chip select signal 132 from the memory control unit 125. At this point, the chip select signal 132 is used for decreasing an operational current by inhibiting the data read/write operation for a predetermined period of time, or in the case where the LSI adopts a bank memory with a large capacity by using plural memories each with a small capacity, the chip select signal 132 is used for making a selected bank memory alone accessible by inhibiting the read/write operation on other memories apart from the selected bank memory.

The memory control unit 125 includes a second scan path circuit 126 for conducting the scan test of the memory control unit 125 and a memory control circuit 127 for controlling the input/output operation of the memory circuit unit 120. The scan-functioning flip-flops 111A and 111B are connected with the second scan path circuit 126 in series through a scan path 131.

Between the memory circuit unit 120 and the memory control unit 125, selectors 128 are interposed, which are switched in accordance with a test mode signal 133 activated in conducting the read/write test of the memory circuit unit 120.

For the scan test in the memory circuit unit 120, a scan-in signal 131a is input to the flip-flop 121a, passes through the flip-flop 121b and enters the flip-flop 121c, which outputs a scan-out signal 131b. Thus, the scan test is conducted by forming the scan path 131.

The specific method of the scan test is described in the aforementioned publication by Kinoshita et al.

In conducting the read/write test of the memory in the memory circuit unit 120, the test mode signal 133 is activated. This activation keeps the chip select signal 132 always activated during the test of the memory circuit unit 120. While the chip select signal 132 is being activated, the read/write operation on the memory circuit unit 120 is enabled, and while the chip select signal 132 is being deactivated, the read/write operation on the memory circuit unit 120 is inhibited.

When the test mode signal 133 is deactivated as in the normal operation mode, the chip select signal 132 has a substantially undefined value because it depends upon a control output of the memory control unit 125. Specifically, in the normal operation mode, the chip select signal 132 is activated by the memory control unit 125 in the cases where current consumption excluding a stationary current is to be decreased by inhibiting an access to the memory and where an access to the bank memories apart from a selected bank memory is inhibited when the memory includes plural banks.

On the other hand, when the test mode signal 133 is activated, the selector 128 selects a test data bus TB, and a test data value is input to the memory circuit unit 120 through the internal data bus DIN of the memory circuit unit 120. As a result, the memory circuit unit 120 can be directly or indirectly accessed from the outside of the LSI. Therefore, a predetermined memory pattern is written in the memory circuit unit 120 by using the test data bus TB, a test address bus TA and a test memory control signal TC, and a read value of the test data output from a test output terminal is compared with an expected value. Thus, the read/write test of the memory circuit unit 120 is completed.

As described above, the read/write test is not sufficient for testing the memory circuit unit 120 but the data holding test is also required. The data holding test is significant for preventing the problem that stored data are disappeared before a defined data holding period elapses due to an abnormal leakage current and supply voltage dependency resulting from a defect caused in the manufacture of the memory.

However, according to the aforementioned method of testing the conventional LSI, a time period of several tens through several hundreds ms is required for the data holding test of the memory circuit unit 120. This time period is longer than time required for another test, whose basic operation cycle is (several ns through several tens ns)×(the number of patterns). Therefore, most of time required for the test of the LSI should be spent for the data holding test.

Furthermore, during the scan test for testing the image processor 110 and the memory control unit 125 of the LSI, the flip-flops 121a through 121c are not controlled to have their contents retained at constant values, and hence the content of the memory core 123 cannot be guaranteed. Therefore, the time for the data holding test cannot be shared by the scan test. In addition, due to the high integration of the image processor 110 and the memory control unit 125, the scan test itself tends to require a longer test time.

In this manner, since the content of the memory cannot be controlled to be updated during the data holding test, the time required for testing the entire LSI is disadvantageously increased.

SUMMARY OF THE INVENTION

The object of the invention is, in a semiconductor integrated circuit device including a memory circuit and a logic circuit, decreasing a test time required for testing the entire semiconductor integrated circuit device.

In order to achieve the object, in the present invention, in a semiconductor integrated circuit device including a memory circuit unit provided with a first scan path circuit and a chip select terminal and a logic circuit unit provided with a second scan path circuit connected with the first scan path circuit, a chip select signal is controlled in a test mode for executing a memory test, so that a data holding test of the memory circuit unit and a function test of the logic circuit unit are carried out in parallel with each other.

The semiconductor integrated circuit device of this invention comprises a memory circuit unit, including a first scan path circuit for holding at least one of an address signal, a data signal and a read/write control signal necessary for a data read/write operation, for enabling/inhibiting the data read/write operation in a predetermined area specified by the address signal in accordance with an input chip select signal; a logic circuit unit for controlling an operation of the memory circuit unit; a second scan path circuit disposed in the logic circuit unit and connected with the first scan path circuit for conducting an operation test of the logic circuit unit; and a chip select signal generator, which receives a test mode signal activated in conducting a memory test of the memory circuit unit and a chip select control signal for controlling a state of the chip select signal, for generating the chip select signal from the chip select control signal in accordance with the test mode signal and outputting the chip select signal to the memory circuit unit.

This semiconductor integrated circuit device is provided with the chip select signal generator for generating the chip select signal from the chip select control signal in accordance with the test mode signal and outputting the chip select signal to the memory circuit unit. Therefore, even during the data holding test, which is one of memory tests, where the test mode signal is activated and the data are not updated, the chip select signal can be enabled by transiting the chip select control signal to the deactivated state. Accordingly, even when the operation test of the logic circuit unit is conducted by using the first scan path circuit included in the memory circuit unit and the second scan path circuit included in the logic circuit unit in parallel with the data holding test, the data stored in the memory circuit unit can be prevented from being updated. Thus, the operation test of the logic circuit unit can be carried out in parallel with the data holding test, and hence, the time required for testing the entire device can be shortened.

In one aspect of the semiconductor integrated circuit device, the chip select control signal is preferably externally input. Thus, there is no need to provide an additional circuit for controlling the memory circuit unit with regard to each test step, and hence, the test time can be shortened without increasing an area cost of the device.

In another aspect of the semiconductor integrated circuit device, the logic circuit unit preferably includes a memory control unit for controlling the data read/write operation on the memory circuit unit, and the chip select signal generator preferably includes a selector, which receives a first chip select control signal externally input and a second chip select control signal output by the memory control unit, for selecting the first chip select control signal in accordance with the test mode signal and outputting the selected first chip select control signal to the memory circuit unit as the chip select signal. Thus, the data read/write operation on the memory circuit unit can be inhibited by selecting the externally input first chip select control signal in the test mode. As a result, the operation test of the logic circuit unit can be definitely conducted in parallel with the data holding test.

In still another aspect of the semiconductor integrated circuit device, the logic circuit unit preferably includes a memory control unit for controlling the data read/write operation on the memory circuit unit, and the chip select signal generator preferably includes an AND circuit, which receives a first chip select control signal externally input and a second chip select control signal output by the memory control unit, for calculating a logical AND (i.e., a conjunction) between the first chip select control signal and the second chip select control signal and outputting the calculated logical AND to the memory circuit unit as the chip select signal. Thus, the chip select signal can depend upon the externally input first chip select control signal alone in the test mode by retaining the second chip select control signal from the memory control circuit in the activated state. As a result, the data read/write operation on the memory circuit unit can be inhibited, and hence, the operation test of the logic circuit unit can be definitely conducted in parallel with the data holding test.

In still another aspect of the semiconductor integrated circuit device, the chip select control signal is preferably output by the logic circuit unit. Thus, in the case where the logic circuit unit for receiving the test mode signal includes a memory BIST circuit, the chip select signal generator can definitely inform the memory circuit unit of the chip select signal.

In still another aspect of the semiconductor integrated circuit device, the logic circuit unit preferably includes memory control means for controlling the data read/write operation on the memory circuit unit, test control means for controlling the memory test of the memory circuit unit, and the chip select signal generator, and the chip select signal generator preferably includes a selector, which receives a first chip select control signal output by the test control means and a second chip select control signal output by the memory control means, for selecting the first chip select control signal in accordance with the test mode signal and outputting the selected first chip select control signal to the memory circuit unit as the chip select signal. Thus, the data read/write operation on the memory circuit unit can be inhibited by selecting the first chip select control signal output by the test control means in the test mode. As a result, the operation test of the logic circuit unit can be definitely conducted in parallel with the data holding test.

The present method of testing a semiconductor integrated circuit device, which includes a memory circuit unit, a scan path circuit and a logic circuit unit for controlling an operation of the memory circuit unit, comprises a data write step of writing a predetermined data in the memory circuit unit; a data holding test step of holding the written data in the memory circuit unit by inhibiting a read/write operation on the memory circuit unit for a predetermined period of time; a logic circuit unit operation test step, which is carried out in parallel with the data holding test step, of conducting an operation test of the logic circuit unit by using the scan path circuit; and a data read test step of reading the written data from the memory circuit unit and checking whether or not the read data accords with the predetermined data.

According to this method of testing a semiconductor integrated circuit device, in conducting the operation test of the logic circuit unit, the data holding test where the read/write operation is inhibited for a predetermined period of time can be carried out at the same time as the operation test of the logic circuit unit. Therefore, the time required for testing the entire semiconductor integrated circuit device can be shortened.

The present method of testing a semiconductor integrated circuit device, which includes a memory circuit unit, provided with a first scan path circuit, for holding at least one of an address signal, a data signal and a read/write control signal necessary for a data read/write operation and a logic circuit unit, provided with a second scan path circuit connected with the first scan path circuit, for controlling an operation of the memory circuit unit, comprises a data write step of writing a predetermined data in the memory circuit unit; a data holding test step of holding the written data in the memory circuit unit by inhibiting the data read/write operation on the memory circuit unit for a predetermined period of time; a logic circuit unit operation test step, which is carried out in parallel with the data holding test step, for conducting an operation test of the logic circuit unit by using the first scan path circuit and the second scan path circuit; and a data read test step of reading the written data from the memory circuit unit and checking whether or not the read data accords with the predetermined data.

According to this method of testing a semiconductor integrated circuit device, in conducting the operation test of the circuits in the memory circuit unit and the logic circuit unit, the operation test of the logic circuit unit can be carried out at the same time as the data holding test where the read/write operation is inhibited for a predetermined time period. Accordingly, in a semiconductor integrated circuit device including a scan path circuit in a memory circuit unit for the operation test of a logic circuit unit, the operation test, which cannot be conventionally conducted during the data holding test, can be carried out in parallel with the data holding test in this method. Thus, the time required for testing the entire semiconductor integrated circuit device can be shortened.

In one aspect of the method of testing a semiconductor integrated circuit device, the logic circuit unit operation test step is preferably a scan test step of conducting a scan test on the logic circuit unit by using a scan path including the first scan path circuit and the second scan path circuit. Thus, the operation test of the logic circuit unit can be definitely conducted.

The present method of testing a semiconductor integrated circuit device, which includes a memory circuit unit, provided with a first scan path circuit for holding an address signal necessary for a data read/write operation, for enabling/inhibiting the data read/write operation in a predetermined area specified by the address signal in accordance with an input chip select signal and a logic circuit unit, provided with a second scan path circuit connected with the first scan path circuit, for controlling an operation of the memory circuit unit, comprises the steps of writing a predetermined data in the memory circuit unit by activating the chip select signal; holding the written data in the memory circuit unit by inhibiting the data read/write operation on the memory circuit unit for a predetermined time period by deactivating the chip select signal, and conducting a scan test on the logic circuit unit by using a scan path including the first scan path circuit and the second scan path circuit; and reading the written data from the memory circuit unit and checking whether or not the read data accords with the predetermined data.

According to this method of testing a semiconductor integrated circuit, the written data can be held in the memory by inhibiting the read/write operation on the memory circuit unit for a predetermined time period through deactivation of the chip select signal, and at the same time, the scan test of the logic circuit unit can be carried out by using the scan path including the first scan path circuit of the memory circuit unit and the second scan path circuit of the logic circuit unit. In this manner, the scan test, which cannot be conventionally carried out during the data holding test in a semiconductor integrated circuit device including a scan path circuit in a memory circuit unit for the scan test of a logic circuit, can be conducted in parallel with the data holding test. As a result, the time required for testing the entire device can be shortened.

DETAILED DESCRIPTION OF THE INVENTION

A first embodiment of the invention will now be described with reference to the accompanying drawings.

Figure 1:
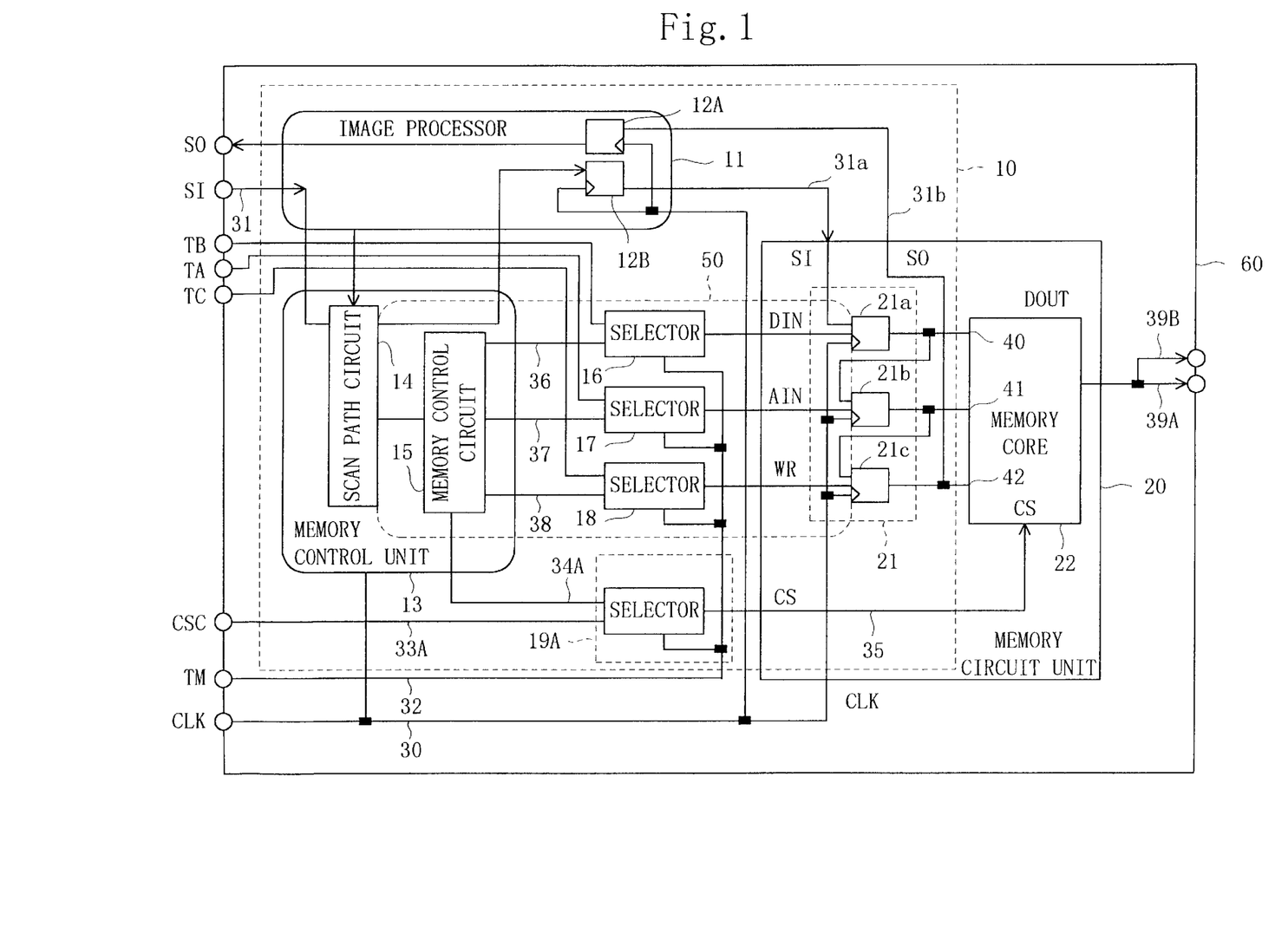
FIG. 1 is a circuit diagram of an LSI according to a first embodiment of the invention.

FIG. 1 is a circuit diagram of an LSI according to this embodiment. As is shown in FIG. 1, on a semiconductor substrate 60 are formed an image processor 11 included in a logic circuit unit 10 for executing an image processing on data according to the MPEG standard and CG data, a memory circuit unit 20, whose input port is included in the logic circuit unit 10, for storing image processed data, and a memory control unit 13 included in the logic circuit unit 10 for controlling an input/output operation of the memory circuit unit 20. Each of the image processor 11, the memory control unit 13 and the memory circuit unit 20 is supplied with a clock signal 30 for synchronizing the input/output of data.

The image processor 11 includes scan-functioning flip-flops 12A and 12B having a scan path for the scan test, which is one of the operation tests for the image processor 11.

The memory control unit 13 is provided with a second scan path circuit 14 including a large number of scan-functioning flip-flops for conducting the scan test of the memory control unit 13 and a memory control circuit 15 for controlling the input/output operation of the memory circuit unit 20. The scan-functioning flip-flops 12A and 12B are connected with the second scan path circuit 14 through a scan path 31.

Between the memory control unit 13 and the memory circuit unit 20, a first selector 16, a second selector 17 and a third selector 18, which are switched in accordance with a test mode signal 32 activated in conducting a read/write test on the memory circuit unit 20, are interposed. The first selector 16 selects a test data bus TB for externally directly or indirectly receiving test data when the test mode signal 32 is activated, and selects a data bus 36 to be output to an internal data bus DIN of the memory circuit unit 20 when the test mode signal 32 is deactivated. The second selector 17 selects a test address bus TA for externally directly or indirectly receiving a test address when the test mode signal 32 is activated, and selects an address bus 37 to be output to an internal address bus AIN of the memory circuit unit 20 when the test mode signal 32 is deactivated. The third selector 18 selects a test memory control signal TC externally directly or indirectly input when the test mode signal 32 is activated, and selects a memory control signal 38 to be output to an internal memory control signal WR, serving as a read/write control signal, of the memory circuit 20 when the test mode signal 32 is deactivated.

Furthermore, between the memory control unit 13 and the memory circuit unit 20, a fourth selector 19A working as a chip select signal generator in accordance with the test mode signal 32 is interposed. The fourth selector 19A selects a first chip select control signal 33A externally input through a chip select control terminal CSC when the test mode signal 32 is activated, and selects a second chip select control signal 34A output by the memory control circuit 15 and outputs a chip select signal 35 to the memory circuit 20 when the test mode signal 32 is deactivated.

The memory circuit unit 20 is provided with a first scan path circuit 21 including a first scan-functioning flip-flop 21a for synchronizing the internal data bus DIN on the basis of the clock signal 30 and outputting a synchronous data signal 40, a second scan-functioning flip-flop 21b for synchronizing the internal address bus AIN on the basis of the clock signal 30 and outputting a synchronous address signal 41, and a third scan-functioning flip-flop 21c for synchronizing the internal memory control signal WR on the basis of the clock signal 30 and outputting a synchronous memory control signal 42. The memory circuit unit 20 is further provided with a memory core 22, which is a primary form of a memory, for receiving the synchronous data signal 40, the synchronous address signal 41 and the synchronous memory control signal 42 for reading, writing and storing data. The memory circuit unit 20 is further provided with a CS terminal for receiving the chip select signal 35, and the chip select signal 35 is used for the above described purposes such as decrease of the operational current by inhibiting a data read/write operation for a predetermined period of time. At a stage subsequent to the memory circuit unit 20, an output terminal for outputting an internal output signal 39A in the normal operation mode and an output terminal for outputting a test output signal 39B in the test mode are disposed.

For conducting the scan test in the memory circuit unit 20, a scan-in signal 31a is input to the scan-functioning flip-flop 21a, passes through the second scan-functioning flip-flop 21b and enters the third scan-functioning flip-flop 21c which outputs a scan-out signal 31b. Thus, the scan test is conducted by forming the serially connected scan path 31.

Since each of the flip-flops 21a, 21b and 21c has the scan function as described above, the circuits between the second scan path circuit 14 and the flip-flops 21a, 21b and 21c, namely, a testable area 50 including the memory control circuit 15 of the memory control unit 13, the first, second and third selectors 16, 17 and 18, can be tested for their operations.

Now, the method of testing the LSI having the aforementioned configuration will be described with reference to FIG. 2(a), which is a timing chart for showing test timing for the LSI of this embodiment.

Figure 2A:
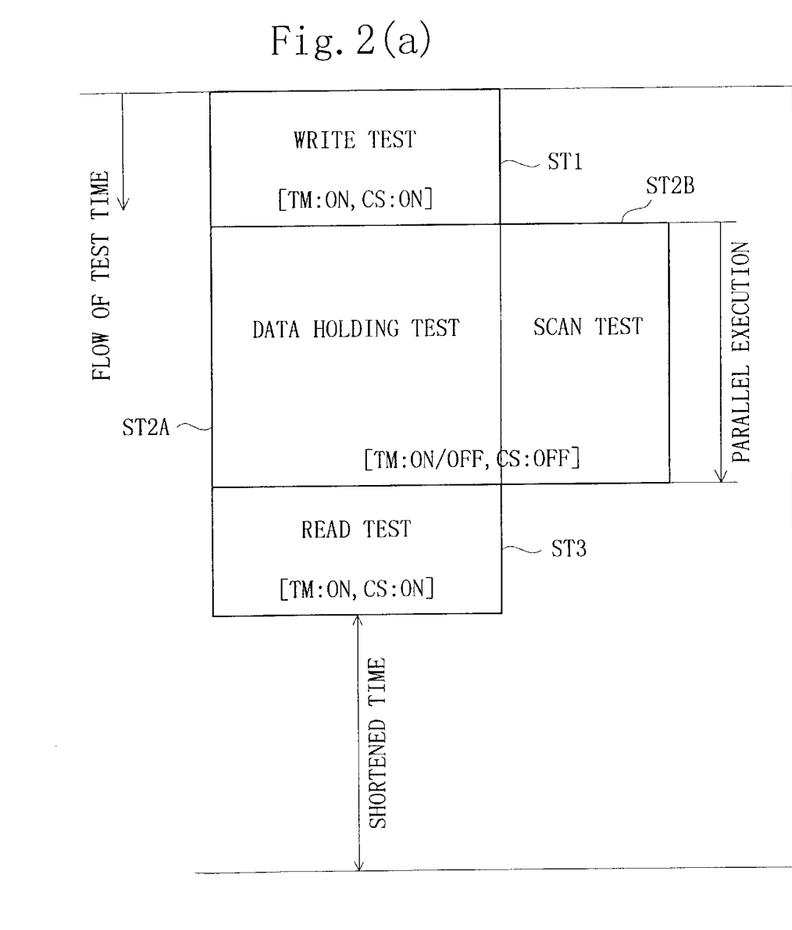
FIG. 2(a) is a timing chart for showing test timing for the LSI according to the first or a second embodiment of the invention.

First, as is shown in FIG. 2(a), in a data write step ST1, the test mode (TM) signal 32 and the first chip select control signal 33A are activated, so that the first selector 16 can select the test data bus TB, thereby inputting a write data to the memory circuit unit 20 through the internal data bus DIN. Also, the activation allows the second selector 17 to select the test address bus TA, thereby inputting a write address to the memory circuit unit 20 through the internal address bus AIN, and the third selector 18 to select the test memory control signal TC, thereby inputting it to the memory circuit unit 20 as the internal memory control signal WR. At this point, the fourth selector 19A selects the first chip select control signal 33A, and the chip select (CS) signal 35 is input to the CS terminal of the memory circuit unit 20.

While keeping the chip select signal 35 activated by activating the first chip select control signal 33A, the data is supplied to the memory circuit unit 20 through the test data bus TB, the address is supplied to the memory circuit unit 20 through the test address bus TA, and the data write control signal is supplied to the memory circuit unit 20 through the test memory control signal TC, all synchronously with the clock signal 30. Thus, the predetermined data is written in a predetermined area of the memory core 22.

At this point, the activation of the test mode signal 32 means that the operation mode of the LSI is the test mode, and the activation of the chip select signal 35 means that the data read/write operation on the memory circuit unit is enabled.

Next, in a data holding test step ST2A, the first chip select control signal 33A is externally deactivated, so that the chip select signal 35 can be deactivated. Thus, the data read/write operation on the memory circuit unit 20 is inhibited for a time period of approximately several tens ms through several hundreds ms, and thus a time period for the data holding test can be secured. Also, in a scan test step ST2B, which is a logic circuit unit operation test carried out in parallel with the data holding test step ST2A, the test mode signal 32 is appropriately deactivated for the necessity of selecting a normal path from the test bus group in the entire circuit, and the logic circuit unit 10 is scan-tested by using the previously set scan path 31.

In this case, since the chip select signal 35 is being deactivated by deactivating the first chip select control signal 33A, the data read/write operation on the memory circuit unit 20 is inhibited regardless of the states of the internal data bus DIN, the internal address bus AIN and the internal memory control signal WR.

Then, after completing both the data holding test step ST2A and the scan test step ST2B, in a data read test step ST3, the first chip select control signal 33A is activated again, so as to activate the chip select signal 35. Thus, the data written in the memory circuit unit 20 in the data write step ST1 is read through the test data bus TB, the test address bus TA and the test memory control signal TC on the basis of the test output signal 39B of the memory circuit unit 20. It is checked whether or not the read data accords with the value written before the data holding test, namely, an expected value, and then the memory test of the memory circuit unit 20 is completed.

Figure 2B:
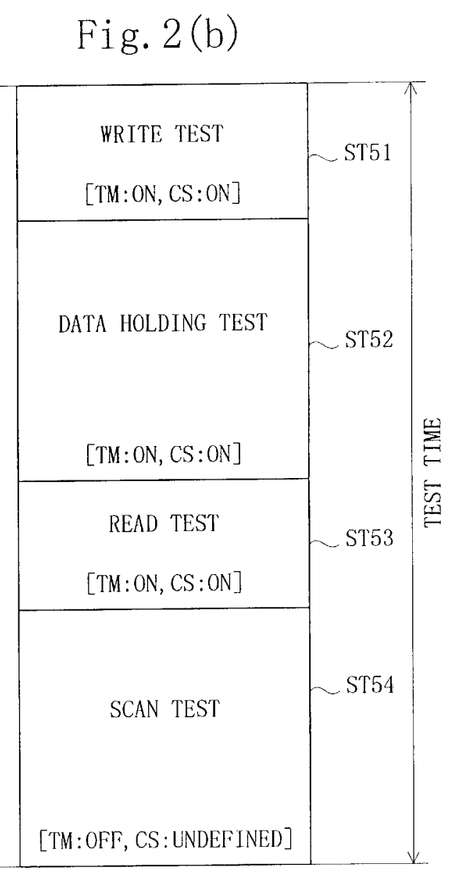
FIG. 2(b) is a timing chart for showing test timing for a conventional LSI.

As described above, a test period where all the operation tests except for the data holding test are inhibited in a data holding test step ST52 shown in a conventional timing chart of FIG. 2(b) can be also allocated to the scan test in this embodiment by deactivating the chip select signal 35 by using the first chip select control signal 33A so as to inhibit the data read/write operation on the memory circuit unit 20. As a result, the data holding test step ST52 and a scan test step ST54, which are conventionally carried out independently of each other, can be carried out in parallel with each other. Therefore, the time required for the test of the entire LSI can be shortened.

Since it is necessary to select the normal path from the test bus group in the scan test, the test mode signal 32 is required to be deactivated. On the other hand, in the read/write test of the memory, the test mode signal 32 is required to be activated for improving the test coverage and the shortening the test time.

However, there is no need to provide the memory control circuit 13 of this embodiment with an additional circuit for conducting the scan test during the data holding test.

In this embodiment, the test mode signal 32 is activated or deactivated at a desired timing by using the externally controlled first chip select control signal 33A selected in the test mode by using the chip select signal 35, which is generally used for decreasing power consumption, realizing the bank memory structure and the like, and by using the fourth selector 19A, which has a simple circuit structure and scarcely increases the area of the entire LSI. In addition, since an unexpected signal noise is hardly caused in switching the chip select signal 35, a careless data access cannot be executed in the memory circuit unit 20 during the data holding test. Accordingly, the data read/write operation on the memory circuit unit 20 can be definitely inhibited.

Furthermore, in general, in the case where a memory circuit to be tested is a synchronous memory circuit synchronizing with a reference clock signal, a scan-functioning flip-flop for synchronizing a data line and a control line of the memory circuit is disposed in a position closest to a memory core or integrated with the synchronous memory circuit. Therefore, since a control circuit cannot be disposed between the scan-functioning flip-flop and the memory core, the content of the scan-functioning flip-flop is rewritten upon occasion through the scan test. Thus, the content of the memory core cannot be guaranteed. Moreover, in general, the test mode is required to be returned to the normal mode in the scan test. Therefore, the content of the memory core can be changed by a memory control signal upon which a delay spike noise or the like derived from a delay between signals in switching the test mode is laid.

In this embodiment, however, since the data read/write operation on the memory core can be definitely inhibited by externally deactivating the chip select signal 35, the data content of the memory core can be guaranteed. Therefore, the data holding test can be definitely carried out even in parallel with the scan test.

The time for executing the data holding test step ST2A can be sufficiently long as compared with an effective cycle of the image procesor 11, the memory control unit 13 and the memory circuit unit 20.

In addition, during the data holding test, not only the access to the data in the memory is inhibited, but also a step of testing whether or not a data value is varied by changing an applied voltage in a predetermined range can be added.

In this embodiment, the scan test is selected as a test carried out in parallel with the data holding test of the memory circuit unit 20. However, the parallel test is not limited to the scan test but can be any test apart from the scan test as far as it does not use the data stored in the memory circuit unit 20.

Now, a first modification of the first embodiment will be described with reference to the accompanying drawing.

Figure 3:
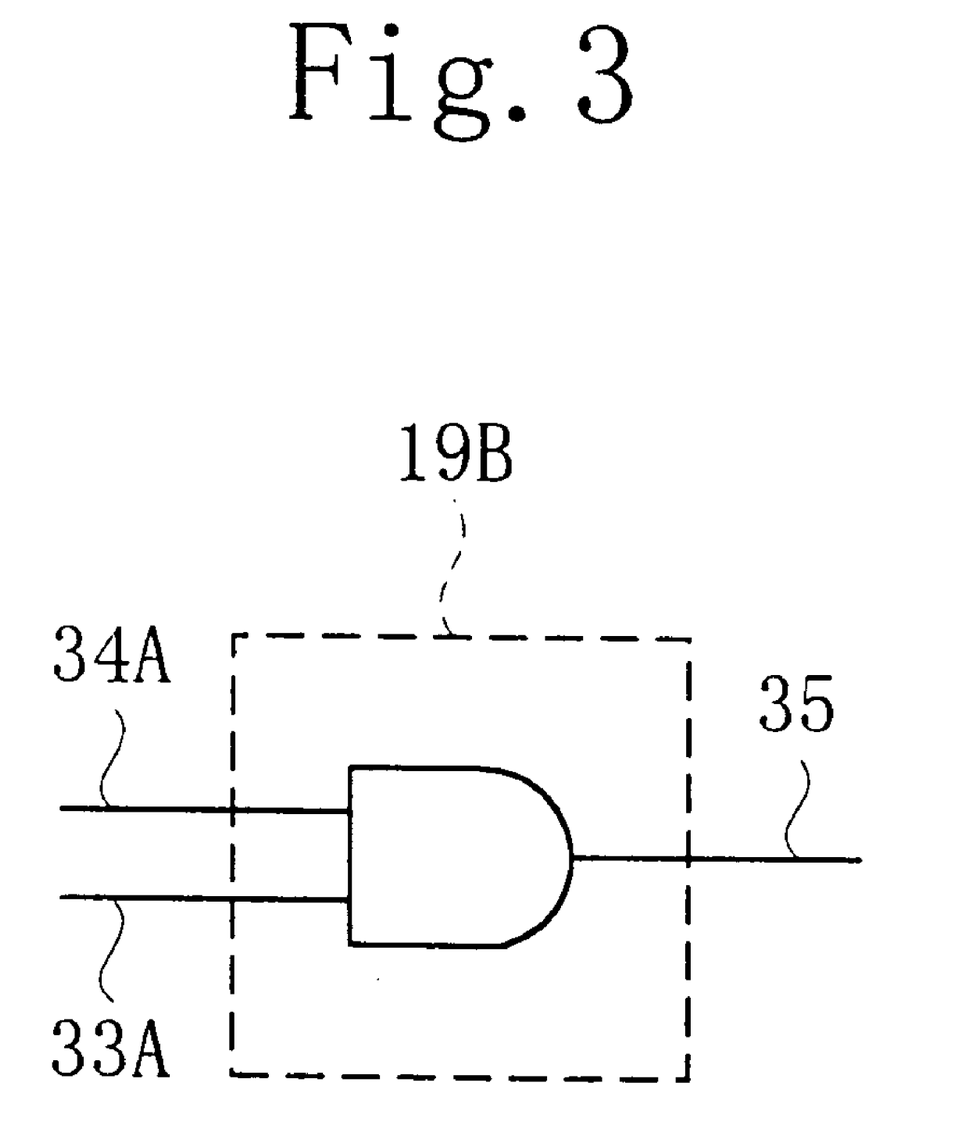
FIG. 3 is a circuit diagram of a chip select signal generator of an LSI according to a first modification of the first embodiment.

FIG. 3 is a circuit diagram of a chip select signal generator of an LSI according to the first modification of the first embodiment. In this modification, the fourth selector 19A working as the chip select signal generator of the first embodiment is replaced with an AND circuit 19B, which calculates the logical AND between the externally input first chip select signal 33A and the second chip select control signal 34A input from the memory control unit 13 and outputs the logical AND as the chip select signal 35 to the memory circuit unit 20.

As a characteristic of this modification, the test mode signal 32 does not directly participate the control of the chip select signal 35. Specifically, while the first chip select control signal 33A is being activated, the second chip select signal 34A, which is a control signal supplied from the memory control circuit 13, is input to the memory circuit unit 20 as the output signal of the AND circuit 19B, namely, as the chip select signal 35. While the first chip select control signal 33A is being deactivated, the chip select signal 35 output by the AND circuit 19B is deactivated, and hence, the data read/write operation on the memory circuit unit 20 is inhibited. In this case, when the logic value is 0, the chip select signal 35 is in the deactivated state, and when the logic value is 1, the chip select signal 35 is in the activated state.

In the normal operation mode, the first chip select control signal 33A is transited to and kept in the activated state, so that the chip select signal 35 output by the AND circuit 19B can depend upon the value of the second chip select control signal 34A output by the memory control unit 13. On the other hand, in the test mode, the second chip select control signal 34A is transited to and kept in the activated state, so that the chip select signal 35 can depend upon the value of the externally input first chip select control signal 33A.

Thus, in this modification, the chip select signal 35 can be controlled to be activated or deactivated on the basis of the test mode signal 32 at a desired timing by using the externally input first chip select control signal 33A as in the first embodiment. Accordingly, the scan test can be parallel carried out through the deactivation of the chip select signal 35 by using the first chip select control signal 33A, so as to inhibit the data read/write operation on the memory circuit unit 20. As a result, the data holding test step ST52 and the scan test step ST54, which are conventionally carried out independently of each other as is shown in FIG. 2(*b*), can be conducted in parallel with each other. Thus, the time required for the test of the entire LSI can be shortened.

Now, a second modification of the first embodiment will be described with reference to the accompanying drawing.

Figure 4:
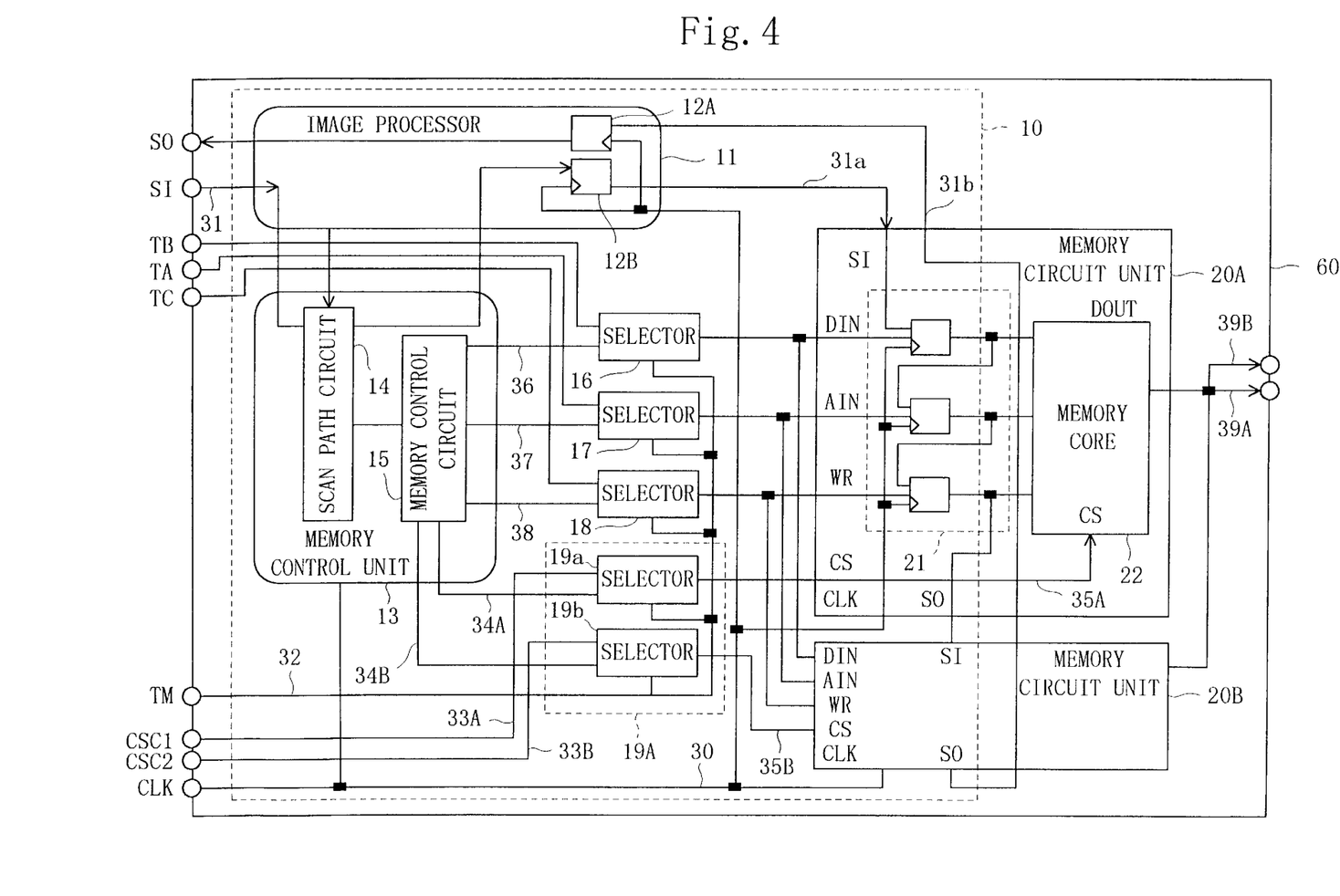
FIG. 4 is a circuit diagram of an LSI according to a second modification of the first embodiment.

FIG. 4 is a circuit diagram of an LSI according to the second modification of the first embodiment. The memory circuit unit 20 adopted in the first embodiment and the first modification thereof does not have a bank memory structure, but a memory circuit unit of this modification has the bank memory structure including a first memory circuit unit 20A and a second memory circuit unit 20B as is shown in FIG. 4. In FIG. 4, like reference numerals are used to refer to like elements used in the first embodiment, and the description is omitted.

The LSI of this modification has a chip select signal generator including a fourth selector 19*a* and a fifth selector 19*b*.

The fourth selector 19*a* selects, on the basis of a test mode signal 32, a first chip select control signal 33A externally input through a first chip select control terminal CSC1 when the test mode signal 32 is activated, and selects a second chip select control signal 34A output by the memory control circuit 15 and outputs a first chip select signal 35A to the first memory circuit unit 20A when the test mode signal 32 is deactivated.

The fifth selector 19*b* selects, on the basis of the test mode signal 32, a first chip select control signal 33B externally input through a second chip select control terminal CSC2 when the test mode signal 32 is activated, and selects a second chip select control signal 34B output by the memory control circuit 15 and outputs a second chip select signal 35B to the second memory circuit unit 20B when the test mode signal 32 is deactivated.

Also in the LSI of this modification having the bank memory structure, the first chip select signal 35A is deactivated by using the first chip select control signal 33A so as to inhibit the data read/write operation on the first memory circuit unit 20A, and the second chip select signal 35B is deactivated by using the first chip select control signal 33B so as to inhibit the data read/write operation on the second memory circuit unit 20B. In this manner, the scan test can be carried out during the data holding test as in the first embodiment. Accordingly, the data holding test and the scan test, which are conventionally carried out independently of each other, can be conducted in parallel with each other, and hence, the time required for the test of the entire LSI can be shortened.

Now, a third modification of the first embodiment will be described with reference to the accompanying drawing.

Figure 5:
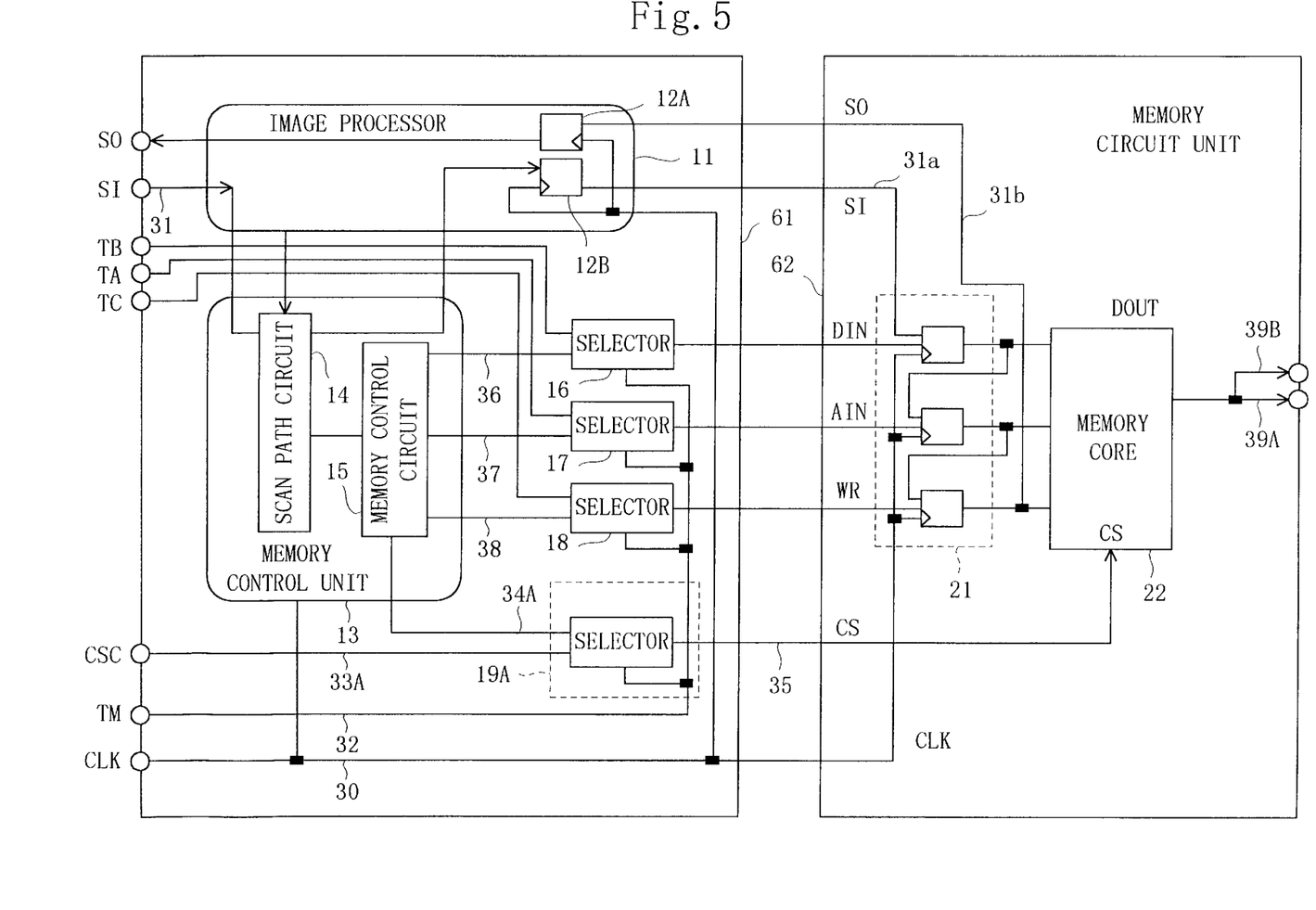
FIG. 5 is a circuit diagram of an LSI according to a third modification of the first embodiment.

FIG. 5 is a circuit diagram of an LSI according to the third modification of the first embodiment. As is shown in FIG. 5, the LSI of this modification comprises an image processor 11, a memory control unit 13, selectors 16 through 18 and 19A, which are formed on a first semiconductor substrate 61, and a memory circuit unit 20 formed on a second semiconductor substrate 62. In FIG. 5, like reference numerals are used to refer to like elements used in the first embodiment, and the description is omitted.

In this modification, the image processor 11 formed on the semiconductor substrate 61 is connected with the memory circuit unit 20 formed on the different semiconductor substrate 62 through a printed substrate or the like. A connecting wire for connecting these substrates can be easily tested by forming a scan path 31 including a first scan path circuit 21 of the memory circuit unit 20 on the semiconductor substrate 62.

Furthermore, similarly to the first embodiment, a chip select signal 35 is deactivated by using a first chip select control signal 33A, so as to inhibit the data read/write operation on the memory circuit unit 20 on the semiconductor substrate 62. Thus, the scan test can be carried out even during the data holding test. In this manner, the data holding test and the scan test, which are conventionally conducted independently of each other, can be conducted in parallel with each other, and hence, the time required for the test of the entire LSI can be shortened.

In the first embodiment and the modifications thereof, the circuit for image processing is used in the logic circuit unit, but the invention is not limited to the image processor and any functional circuit including other logic circuits can be used in the logic circuit unit.

Also, the selector is used as the chip select signal generator, but the chip select signal generator is not limited to the selector but can be any logic circuit for obtaining an output signal equivalent to that of the selector.

Now, a second embodiment of the invention will be described with reference to the accompanying drawings.

Figure 6:
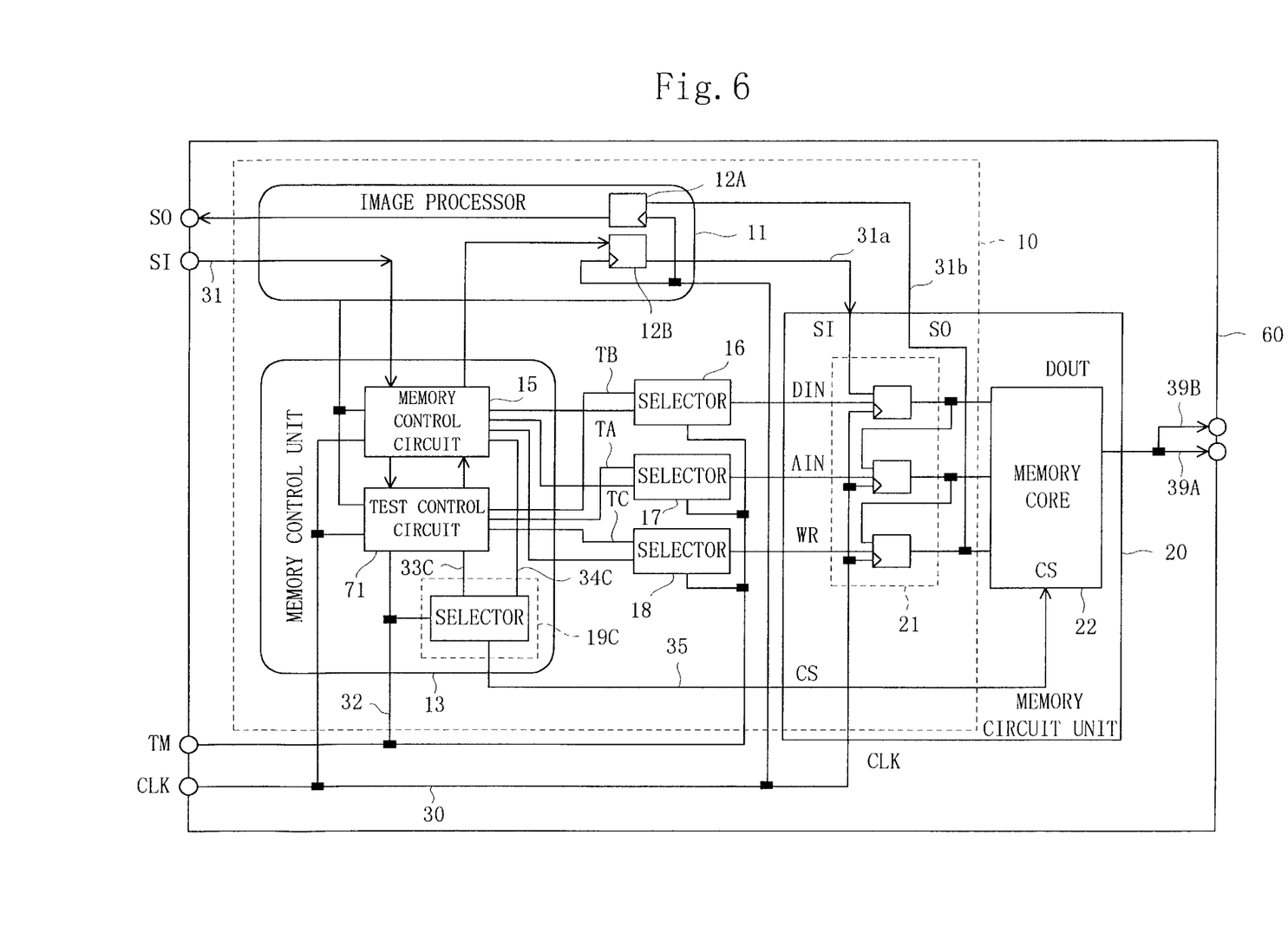
FIG. 6 is a circuit diagram of an LSI according to the second embodiment of the invention.

FIG. 6 is a circuit diagram of an LSI according to the second embodiment. As is shown in FIG. 6, on a semiconductor substrate 60 are formed an image processor 11, included in a logic circuit unit 10, for executing an image processing on data according to the MPEG standard and the like, a memory circuit unit 20, whose input port is included in the logic circuit unit 10, for storing image processed data, and a memory control unit 13, included in the logic circuit unit 10, for controlling the input/output operation of the memory circuit unit 20. In FIG. 6, like reference numerals are used to refer to like elements used in the first embodiment, and the description is omitted.

As a characteristic of this embodiment, the memory control unit 13 includes a memory control circuit 15 working as memory control means for controlling the input/output operation of the memory circuit unit 20 through first through third selectors 16 through 18; a test control circuit 71, designated as a memory BIST (build in self test) circuit, working as test control means for conducting a test of a memory core 22 in the memory circuit unit 20 through the first through third selectors 16 through 18; and a fourth selector 19C working as a chip select signal generator.

The fourth selector 19C selects a first chip select control signal 33C output by the test control circuit 71 when a test mode signal 32 is activated, and selects a second chip select control signal 34C output by the memory control circuit 15 and outputs a second chip select signal 35 to the memory circuit unit 20 when the test mode signal 32 is deactivated.

The procedures for respective tests will now be described with reference to FIG. 2(a).

First, in a data write step ST1, the test mode signal 32 is activated, so that the first selector 16 can select a test data bus TB, the second selector 17 can select a test address bus TA and the third selector 18 can select a test memory control signal TC. Thus, a test data output by the test control circuit 71 is written in the memory core 22. In this case, the fourth selector 19C selects and outputs the first chip select control signal 33C in the activated state output by the test control circuit 71.

Then, in a data holding test step ST2A, the test control circuit 71 deactivates the first chip select control signal 33C, so as to freeze the operation of the memory core 22 for a time period of several tens ms through several hundreds ms. In a scan test step ST2B, which is a logic circuit unit operation test step conducted in parallel with the data holding test step ST2A, the test mode signal 32 is appropriately deactivated for the necessity of selecting a normal path from the test bus group, and the scan test is carried out by using a scan path 31. Thus, the image processor 11, the memory control unit 13 and the selectors 16 through 18 are tested for their operations.

Next, in a data read test step ST3, which follows completion of both the data holding test step ST2A and the scan test step ST2B, the first chip select control signal 33C is activated again so as to activate the chip select signal 35. Thus, the data written in the memory core in the data write step ST1 is read on the basis of a test output signal 39B of the memory circuit unit 20 through the test data bus TB, the test address bus TA and the test memory control signal TC. It is checked whether or not the read data accords with an expected value, and the memory test of the memory circuit unit 20 is thus completed.

In this manner, the scan test can be carried out even during the data holding test in this embodiment by inhibiting the data read/write operation on the memory circuit unit 20 through deactivation of the chip select signal 35 by using the first chip select control signal 33C. Accordingly, the data holding test and the scan test, which are conventionally conducted independently of each other, can be carried out in parallel with each other, and hence, the time required for the test of the entire LSI can be shortened.

The time for executing the data holding test step ST2A can be sufficiently long as compared with an effective cycle of the image processor 11, the memory control unit 13 and the memory circuit unit 20.

Now, a modification of the second embodiment will be described with reference to the accompanying drawing.

Figure 7:
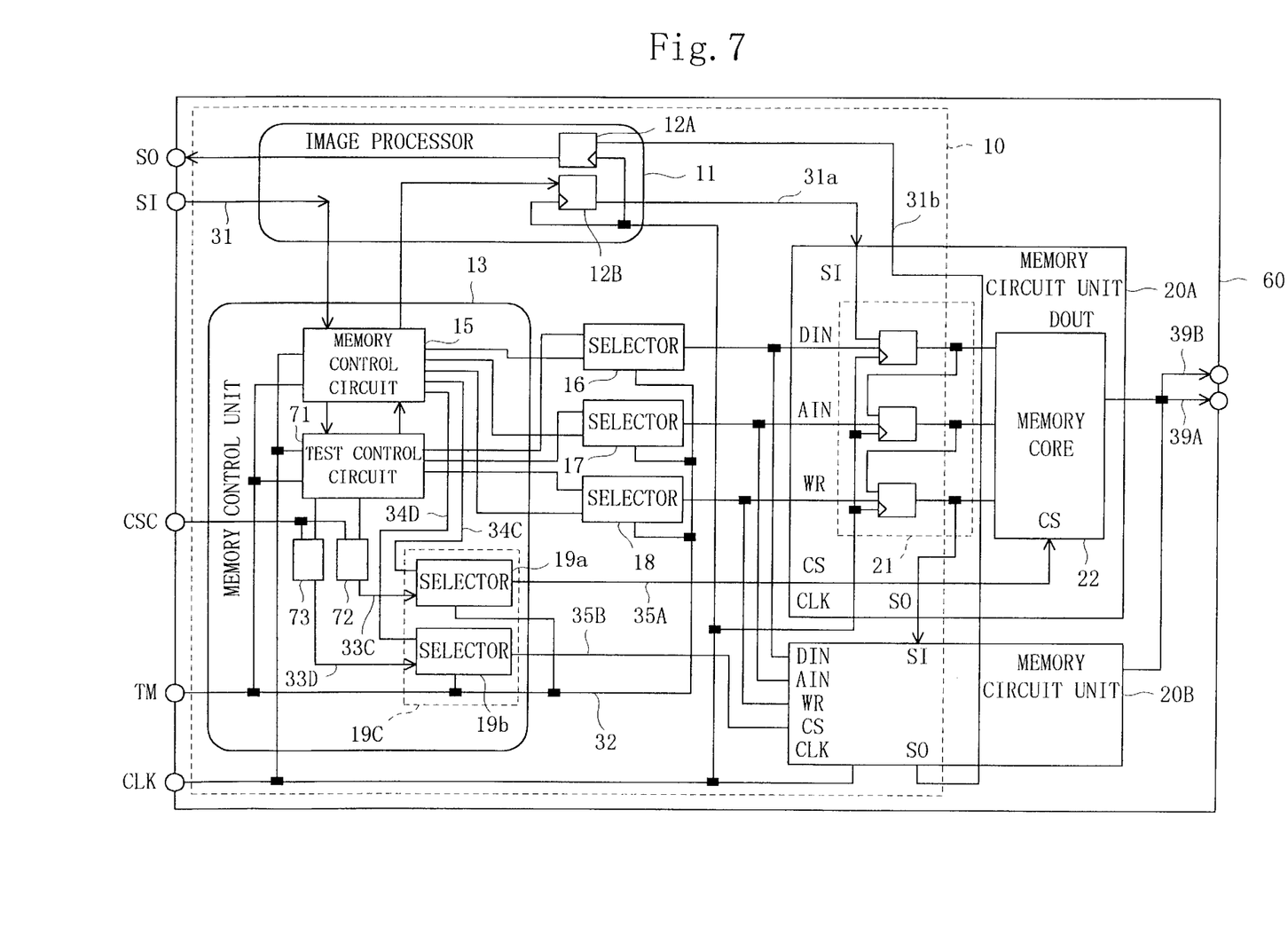
FIG. 7 is a circuit diagram of an LSI according to a modification of the second embodiment.

FIG. 7 is a circuit diagram of an LSI according to the modification of the second embodiment. Although the memory circuit unit 20 of the second embodiment does not have the bank memory structure, a memory circuit unit 20 of this modification has the bank memory structure, as is shown in FIG. 7, including a first memory circuit unit 20A and a second memory circuit unit 20B. In FIG. 7, like reference numerals are used to refer to like elements used in the second embodiment, and the description is omitted.

A memory control unit 13 of this modification includes a fourth selector 19a and a fifth selector 19b working as the chip select signal generators. The memory control unit 13 further includes a first AND circuit 72 for calculating the logical AND between a signal externally input through a chip select control terminal CSC and a signal output by a test control circuit 71 and outputting the calculated logical AND to the fourth selector 19a, and a second AND circuit 73 for calculating the logical AND between the signal externally input through the chip select control terminal CSC and the signal output by the test control circuit 71 and outputting the calculated logical AND to the fifth selector 19b.

The fourth selector 19a selects, on the basis of a test mode signal 32, a first chip select control signal 33C output by the first AND circuit 72 when the test mode signal 32 is activated, and selects a second chip select control signal 34C output by a memory control circuit 15 and outputs a first chip select signal 35A to the first memory circuit unit 20A when the test mode signal 32 is deactivated.

The fifth selector 19b selects, on the basis of the test mode signal 32, a first chip select control signal 33D output by the second AND circuit 73 when the test mode signal 32 is activated, and selects a second chip select control signal 34D output by the memory control circuit 15 and outputs a second chip select signal 35B to the memory circuit unit 20B when the test mode signal 32 is deactivated.

Also in the LSI having the bank memory structure of this modification, the scan test can be carried out even during the data holding test as in the second embodiment by inhibiting the data read/write operation on the first memory circuit unit 20A through the deactivation of the first chip select signal 35A by using the first chip select control signal 33C, and by inhibiting the data read/write operation on the second memory circuit unit 20B through the deactivation of the second chip select signal 35B by using the first chip select control signal 33D. Accordingly, the data holding test and the scan test, which are conventionally carried out independently of each other, can be conducted in parallel with each other, and hence, the time required for the test of the entire LSI can be shortened.

In the second embodiment and the modification thereof, the circuit for image processing is used in the logic circuit unit, but the invention is not limited to the image processor and any functional circuit including other logic circuits can be used in the logic circuit unit.

Furthermore, the selector is used as the chip select signal generator, but the chip select signal generator is not limited to the selector but can be any logic circuit for obtaining an output signal equivalent to that of the selector.

What is claimed is:

1. A semiconductor integrated circuit device comprising:
   a logic circuit unit comprising a scan path circuit, said logic circuit capable of performing a read/write operation;
   a memory circuit unit for storing data, said data being read from and written into said memory circuit unit by said logic circuit unit and an external element; and
   a chip select signal generator for generating a chip select signal which enables/inhibits a data read/write operation on said memory circuit unit, said chip select signal generator outputting said chip select signal to said memory circuit unit;
   wherein said chip select signal generator receives a first chip select control signal having a logical value corresponding to a type of a memory test to be performed on said memory circuit unit and a second chip select control signal, said chip select signal generator determining a logical value of said chip select signal based on the received first and second chip select control signals.

2. The semiconductor integrated circuit device of claim 1, wherein said chip select control signal is externally input.

3. The semiconductor integrated circuit device of claim 1, wherein
   said logic circuit unit includes a memory control unit for reading data from, and writing data into, said memory circuit unit,
   said first chip select control signal is externally inputted, while said second chip select control signal is outputted from said memory control unit, and
   said chip select signal generator includes a selector, which receives said first chip select control signal and said second chip select control signal, said selector operative for selecting said first chip select control signal in accordance with said test mode signal and outputting said selected first chip select control signal to said memory circuit unit as said chip select signal.

4. The semiconductor integrated circuit device of claim 1, wherein
   said logic circuit unit includes a memory control unit for reading data from, and writing data into, said memory circuit unit,
   said first chip select control signal is externally inputted, while said second chip select control signal is outputted from said memory control unit, and
   said chip select signal generator includes an AND circuit, which receives said first chip select control signal and said second chip select control signal, said AND circuit operative for calculating a logical AND between said first chip select control signal and said second chip select control signal and outputting said calculated logical AND to said memory circuit unit as said chip selected signal.

5. The semiconductor integrated circuit device of claim 1, wherein said chip select control signal is output by said logic circuit unit.

6. The semiconductor integrated circuit device of claim 1, wherein said logic circuit unit includes;
   memory control means for reading data from, and writing data into, said memory circuit unit; and test control means for conducting the memory test of said memory circuit unit so as to determine whether data written into said memory circuit unit can be read in the same state, and said chip select signal generator;
   said first chip select control signal comprises a signal externally inputted and another signal outputted from said test control means, while said second chip select control signal is outputted from said memory control means, and
   said chip select signal generator includes a selector, which receives said first chip select control signal and said second chip select control signal, said selector operative for selecting said first chip select control signal in accordance with said test mode signal and outputting said selected first chip select control signal to said memory circuit unit as said chip select signal.

7. A method of testing a semiconductor integrated circuit device, which includes a memory circuit unit and a logic circuit unit comprising a scan path circuit, comprising:
   a data write step of writing a predetermined data in said memory circuit unit;
   a data holding test step of holding said written data in said memory circuit unit by inhibiting a read/write operation on said memory circuit unit for a predetermined period of time;
   performing a logic circuit unit operation test, which is carried out in parallel with said data holding test step, said logic circuit unit operation test utilizing said scan path circuit; and
   a data read test step of reading said written data from said memory circuit unit and checking whether or not said read data accords with said predetermined data.

8. A method of testing a semiconductor integrated circuit device which includes:
   a memory circuit unit for holding at least one of an address signal, a data signal and a read/write control signal necessary for a data read/write operation:
   a logic circuit unit:
   a first scan path circuit which is used in common by said memory circuit unit and said logic circuit unit; and
   a second scan path circuit which is included in said logic circuit unit and connected with said first scan path circuit,
   said method comprising:
   a data write step of writing a predetermined data in said memory circuit unit;
   a data holding test step of holding said written data in said memory circuit unit by inhibiting the data read/write operation on said memory circuit unit for a predetermined period of time;
   performing a logic circuit unit operation test, which is carried out in parallel with said data holding test step, said logic circuit unit operation test utilizing said first scan path circuit and said second scan path circuit; and
   a data read test step of reading said written data from said memory circuit unit and checking whether or not said read data accords with said predetermined data.

9. The method of testing a semiconductor integrated circuit device of claim 8,
   wherein said logic circuit unit operation test step comprises performing a scan test on said logic circuit unit, said scan test utilizing a scan path including said first scan path circuit and said second scan path circuit.

10. A method of testing a semiconductor integrated circuit device, said semiconductor integrated circuit comprising a memory circuit unit; a first scan path circuit for holding at least one of an address signal, a data signal and a read/write control signal necessary for enabling/inhibiting the data read/write operation in a predetermined area specified by said address signal in accordance with an input chip select signal; and a logic circuit unit, said logic circuit unit provided with a second scan path circuit connected with said first scan path cirucit, for controlling an operation of said memory circuit unit, said method comprising the steps of:

writing a predetermined data in said memory circuit unit by activating said chip select signal;

holding said written data in said memory circuit unit by inhibiting the data read/write operation on said memory circuit unit for a predetermined time period by deactivating said chip select signal, and conducting a scan test on said logic circuit unit, said scan test utilizing a scan path including said first scan path circuit and said second scan path circuit; and reading said written data from said memory circuit unit and checking whether or not said read data accords with said predetermined data.

\* \* \* \* \*